United States Patent [19]

Ragonese et al.

[11] Patent Number: 4,475,280
[45] Date of Patent: Oct. 9, 1984

[54] METHOD OF MAKING AN INTEGRATED CIRCUIT INCORPORATING LOW VOLTAGE AND HIGH VOLTAGE SEMICONDUCTOR DEVICES

[75] Inventors: Louis J. Ragonese; Nicholas A. Schmitz, both of Liverpool; Saverio F. Bevacqua, Fulton; King Owyang, Baldwinsville, all of N.Y.

[73] Assignee: General Electric Company, Syracuse, N.Y.

[21] Appl. No.: 450,687

[22] Filed: Dec. 17, 1982

Related U.S. Application Data

[62] Division of Ser. No. 219,824, Dec. 24, 1980, Pat. No. 4,412,142.

[51] Int. Cl.$^3$ ............................................. H01L 21/80
[52] U.S. Cl. .................................... 29/577 C; 29/578; 148/1.5; 148/175
[58] Field of Search .................. 29/576 B, 577 C, 577; 357/13, 35, 89, 46, 92; 148/1.5, 175

[56] References Cited

U.S. PATENT DOCUMENTS

| | | | |
|---|---|---|---|
| 3,982,269 | 9/1976 | Torreno, Jr. et al. | 357/48 |
| 4,258,379 | 3/1981 | Watanabe et al. | 357/46 |
| 4,286,177 | 8/1981 | Hart et al. | 357/92 |
| 4,348,600 | 9/1982 | Jarrett et al. | 357/35 |

OTHER PUBLICATIONS

Hart et al., "Bipolar LSI takes a new direction with integrated injection logic", *Electronics*, Oct. 3, 1974, pp. 111–118.

*Primary Examiner*—Aaron Weisstuch
*Assistant Examiner*—Hunter L. Auyang
*Attorney, Agent, or Firm*—Richard V. Lang; Carl W. Baker

[57] ABSTRACT

An integrated circuit incorporating high voltage semiconductor devices which are controlled by low voltage semiconductor devices is disclosed, including a method for making the same. The low voltage devices which are capable of realizing complex logic functions on the same chip are realized with only one simple extra step in the fabrication process as compared with the process used to fabricate discrete high voltage power transistors. The process addition to implant the low voltage device does not significantly degrade the original capability associated with discrete power transistors. Both laterally developed and vertically developed devices are described. The integrated circuit combines I$^2$L logic with power Darlington transistors. A large area ion implantation permits one to fabricate both low and high voltage devices on one substrate. The resulting integrated circuit permits a plurality of loads to be controlled by a simple or complex control function.

12 Claims, 6 Drawing Figures

METHOD OF MAKING AN INTEGRATED CIRCUIT INCORPORATING LOW VOLTAGE AND HIGH VOLTAGE SEMICONDUCTOR DEVICES

This application is a division of application Ser. No. 219,824 filed Dec. 24, 1980, now U.S. Pat. No. 4,412,142.

BACKGROUND OF THE INVENTION

1. Field of the Invention

The present invention relates to semiconductor devices of low and high voltage, vertically and laterally developed and to a combination of such devices on a single substrate. The present invention also relates to integrated injection logic combining low voltage devices, both laterally and vertically developed, which are in turn combined with high voltage devices, both laterally and vertically developed, with the latter, vertically developed devices, being associated, optimally, in a "Darlington" connection. The invention also relates to the method of making such combined devices.

2. Description of the Prior Art

Vertically developed power transistors with the collectors down, and emitters up are conventional. Darlington connected power transistors, in which the collectors are formed lowermost, with the collectors sharing a common interconnecting region and common contacts are also conventional.

Such power devices are most commonly available in the NPN format using a substrate of N+ type material, upon which an N type epitaxial layer is formed. The NPN bases, of P material, are formed from the top, over the underlying N region, by a diffusing process. The NPN emitters are then formed over the bases. The final arrangement is a vertically developed transistor, having a first junction between collector and base and a second junction between base and emitter. Such vertical devices may be combined by a "Darlington" connection in which the emitter of one device is coupled to the base of the other device, and their collectors are connected together, by sharing the common, lower N region and a common substrate contact. It is also known that the devices may be conveniently driven by the addition of a laterally developed PNP transistor formed on the same substrate, which may be connected to the base of the "one" NPN.

Low voltage integrated injection logic (I²L) has been described in the literature, as for instance Hart, C. M. and Slob, A., "Integrated Injection Logic—A New Approach to LSI", 1972 IEEE International Solid State Circuits Conference Proceedings, pp 92–93, and Berger, H. H. and Wiedman, S. K., "Merged Transistor Logic—A Low Cost Bipolar Logic Concept", 1972 ISSCC Proceedings, pp. 90–91. In addition, certain practical fdevices using the I²L technique have been marketed by several semiconductor manufacturers.

The technique has several attractive features. One desirable feature of the technique is that the speed power product is very small, being demonstrated at less than 1.0 picojoules. In addition, because it can use conventional linear bipolar devices, the fabrication processes are conventional and manufacturing costs are relatively inexpensive.

The integrated injection logic, conventional integrated bipolar transistors are operated in an inverted mode. In I²L logic, NPN transistors, which consist of successive horizontal layers have their emitter lowermost, the base above the emitter, and the collector topmost, usually in separate islands within the base. The resultant multiple collector device is compact and, when supplied with an appropriate base biasing current source or "injector", constitutes a basic "NOR" type gate, building block. The "NOR" function results when the collectors of different multiple collector devices are connected together. The current source used to bias the base of the I²L multi-collector NPN transistors can be realized in many ways. The most popular I²L configuration uses a lateral PNP transistor as the base biasing source. Another elementary I²L function is that of simple inversion requiring a single collector, NPN and PNP base biasing source.

SUMMARY OF THE INVENTION

Accordingly, it is an object of the present invention to provide an improved integrated circuit combining low voltage and high voltage devices.

It is a further object of the present invention to provide an improved integrated circuit combining vertically and horizontally developed low voltage devices and vertically and horizontally developed high voltage devices.

It is still another object of the invention to provide an improved integrated circuit in which low voltage control logic is present to control power switching devices.

Accordingly, it is an additional object of the present invention to provide a simplified method of making an integrated circuit combining low voltage and high voltage devices.

It is a further object of the present invention to provide an improved method of making an integrated circuit combining vertically and horizontally developed low voltage devices and vertically and horizontally developed high voltage devices.

It is still another object of the invention to provide an improved method of making an integrated circuit in which low voltage control logic is present to control power switching devices.

These and other objects of the invention are achieved in a novel integrated circuit comprising a monolithic substrate having an underlying highly doped first region of a first conductivity type, and a second moderately doped region of the first conductivity type overlying the first region and epitaxially formed. Power transistor means are formed on the subrate, which include a first vertically developed power transistor, having a first underlying collector, defined in the second region, a first base of a second conductivity type, disposed upon the first collector, and a first emitter of the first conductivity type, disposed upon and horizontally bounded by a continuation of the base material. Means for control of the power transistor means are formed in the same substrate, including a second, vertically developed control transistor. The control transistor comprises a second, underlying emitter defined in the second region, a second base, of the second conductivity type, disposed upon the second emitter, and a second collector of the first conductivity type, disposed upon and horizontally bounded by a continuation of the second base material.

The control means also includes means for coupling the collector of the second vertically developed transistor to the base of the first vertically developed transistor. Preferably, the coupling means includes a lateral transistor comprising a third emitter of the second conductivity type, disposed upon the second region, a third base formed of an upwardly extending continuation of the second region, laterally adjacent to the third emitter, and a third collector of the second conductivity type disposed upon the second region, laterally adjacent to the third base and formed as a continuation of the first base material for electrical connection between said third collector and the first base.

In accordance with the invention, the first vertical power transistor and the third, lateral transistor are designed for high voltage operation and the second, vertical control transistor is designed for low voltage operation. To achieve these objectives, the emitter of the second vertical control transistor is of higher conductivity that the collector of the first, vertical power transistor. The base of the first, power transistor is thick in relation to the base of the second, control transistor. The base of the third, lateral transistor has a first region of a higher conductivity equal to that of the emitter of the second, vertical control transistor, and a second region of a lower conductivity equal to that of the collector of the first, vertical power transistor, to form a graded base for improved high voltage performance. In addition, the second region of the substrate has two layers, the lowermost layer being of a high conductivity type than the uppermost layer. Finally, a ring of the second conductivity type is formed around the power transistor means for further improving the high voltage performance.

In accordance with a further aspect of the invention, the power transistor means includes a fourth, vertical power transistor disposed for Darlington interconnection with the first, vertical power transistor.

The arrangement readily permits the addition of other vertical control transistors designed for low voltage operation, each having an emitter in the second region of the substrate for common connection between the emitter. Other horizontal control transistors for current injection into the vertical control transistor may be added. The collector of the current injector may be formed as a lateral continuation of the base of the vertical transistor.

In accordance with a further aspect of the invention, a method for making an integrated circuit of the type including low voltage and high voltage semiconductor devices on a single substrate is disclosed. A substrate is provided having an underlying highly doped first region of a first conductivity type, with a second moderately doped region of the first conductivity type overlying the first region. The doping level in a first volume is increased in respect to a second volume by ion implantation, the volumes extending down from the upper surface of the substrate into the second region. Next, one simultaneously diffuses an impurity of a second conductivity type with device patterning into the first and second volumes to produce a third, device patterned region overlying the second region having a depth in said first volume which differs from that in the second volume. Then, one simultaneously diffuses an impurity of the first conductivity type (with device patterning) into the first and second volumes to produce a fourth, device patterned region overlying the third region. The method produces vertically developed semiconductor devices in the first volume having a geometry differing from the devices in the second volume.

In accordance with a further aspect of the invention, the first diffusion may be patterned to form laterally developed semiconductor devices complementary to the vertically developed semiconductor devices. When the first diffusion patterns occur in the first volume, low voltage devices are formed complementary to the vertically developed semiconductor devices. When the first diffusion patterns occur in both volumes, a laterally developed semiconductor device having a graded base for improved performance may be formed.

Preferably, the provided substrate has a two layer second region, the lowermost layer being of a higher impurity level than the uppermost layer to improve the high voltage performance.

Finally, for improved high voltage performance, a ring of the second conductivity type is formed around the sites for the vertically developed devices in the second volume.

BRIEF DESCRIPTION OF THE DRAWINGS

The novel and distinctive features of the invention are set forth in the claims appended to the present application. The invention itself, however, together with further objects and advantages thereof, may best be understood by reference to the following description and accompanying drawings in which:

FIG. 4a is a cross-section of representative devices, including low voltage lateral and vertical devices, and high voltage lateral and vertical devices, as more particularly shown in the circuit diagram of FIG. 4b, drawn below 4a.

DESCRIPTION OF THE PREFERRED EMBODIMENT

Figure 1:
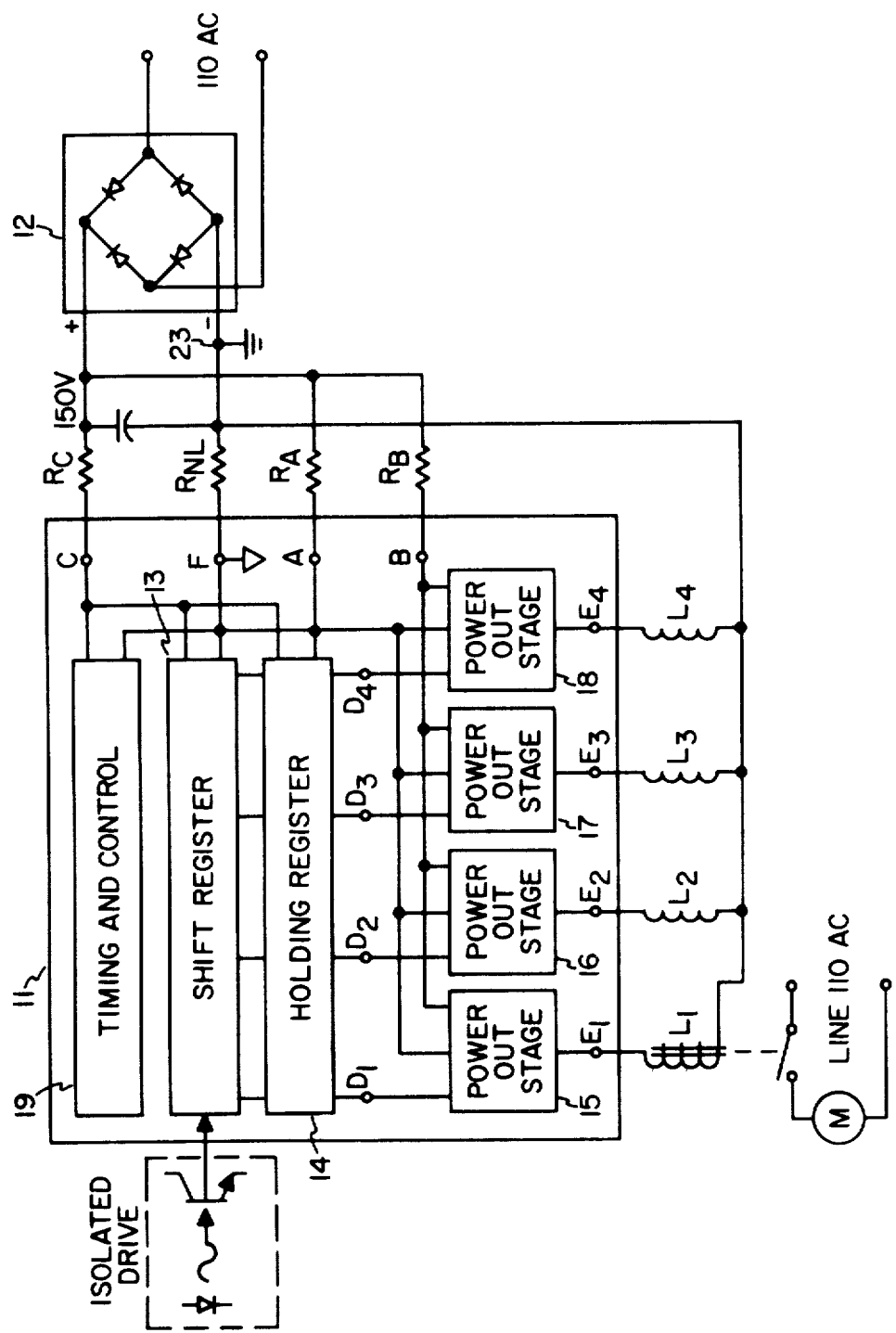
FIG. 1 is a block diagram of that portion of a monolithic microprocessor used to provide control of a plurality of load devices and which includes plural power output stages and low voltage logic for their control.
Figure 2:
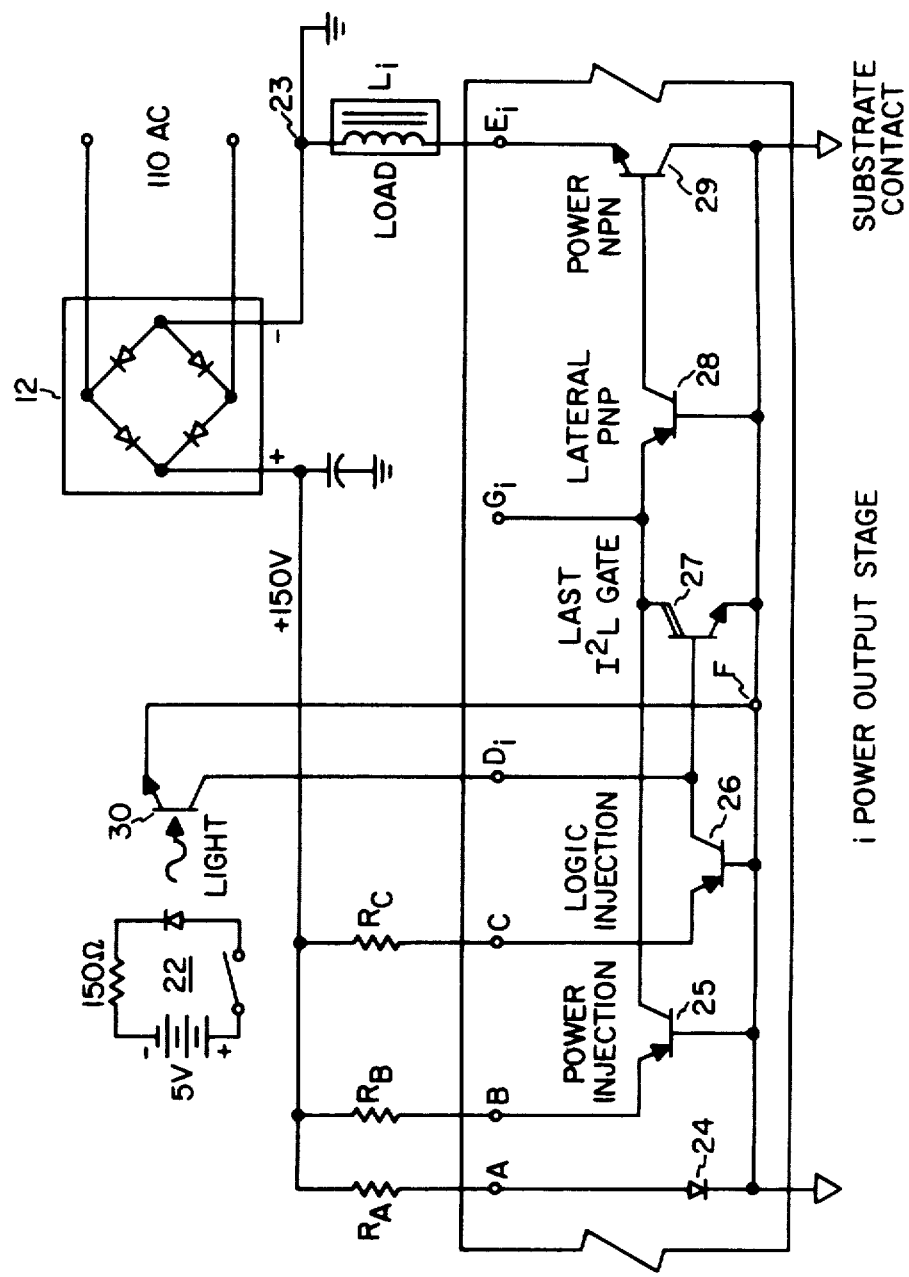
FIG. 2 is an electrical circuit diagram of a power output stage suitable for control of a single load and the immediately associated low voltage logic together with illustrative power, load, and control connections.

Referring now to FIG. 1, a portion of a monolithic microprocessor suitable for logical control of a plurality of load device is illustrated. The power interface is illustrated as a portion of a substrate 11 having a first plurality of terminals A, B, C and F for connection to suitable dc supply potentials; a second plurality of terminals E1, E2, E3 and E4 for connection to suitable loads; and an electrically isolated drive (equivalently represented by an optical coupler) for introducing control information to the chip. As illustrated in FIGS. 1 and 2, the supply power is coupled through serial resistances $R_A$, $R_B$, $R_C$ to substrate terminals A, B and C on the one hand and to ground 23 on the other hand. The supply provides an approximately 150 volt potential for the loads, assuming connection to a 60 cycle, 110 volt ac main through a full wave (or alternately half-wave) rectifier 12. Some capacitive filtering may also be employed to insure continuity of a unidirectional supply potential. The voltages at the terminals A, B and C of the microcircuit are typically 0.7 volts with respect to the substrate contact F, with the voltages at terminals A, B and C being within 0.1 volts of each other as necessary for operation of the I$^2$L control logic 27 and the current injectors 25, 26. The 150 volts (FIG. 1) (less the 1-2 V drop in the circuit) appears at the output terminals $E_1$, $E_2$ $E_3$ and $E_4$ of the power output stages with respect to ground. The loads $L_i$, $L_2$, $L_3$ and $L_4$ are connected respectively between the output terminals $E_1$, $E_2$, $E_3$ and $E_4$ and ground. The load device $L_1$ is shown to be a relay for operation of a power device such as an appliance motor requiring more power than may be conveniently controlled by the integrated circuit or a load requiring ac drive, and solenoids $L_2$, $L_3$ and $L_4$ are provided for actuation of valves, electrical relays, heaters, light bulbs, or other control functions on a single appliance. In a practical example, the loads $L_1$ through $L_4$ may each draw 75-100 milliamperes and thus dissipate approximately about 10 watts and total 40 watts. The circuit may also include a load RNL connected between the substrate contact F and ground 23 to sustain the necessary voltage relationships when no load is drawing current. The isolated drive 22, shown schematically in FIG. 2, utilizes a light emitting diode to illuminate a control transistor 30 which may be formed on the same substrate. The control transistor 30 is the input port for applying external control information to the integrated circuit. Internal control is another option.

Figure 3:
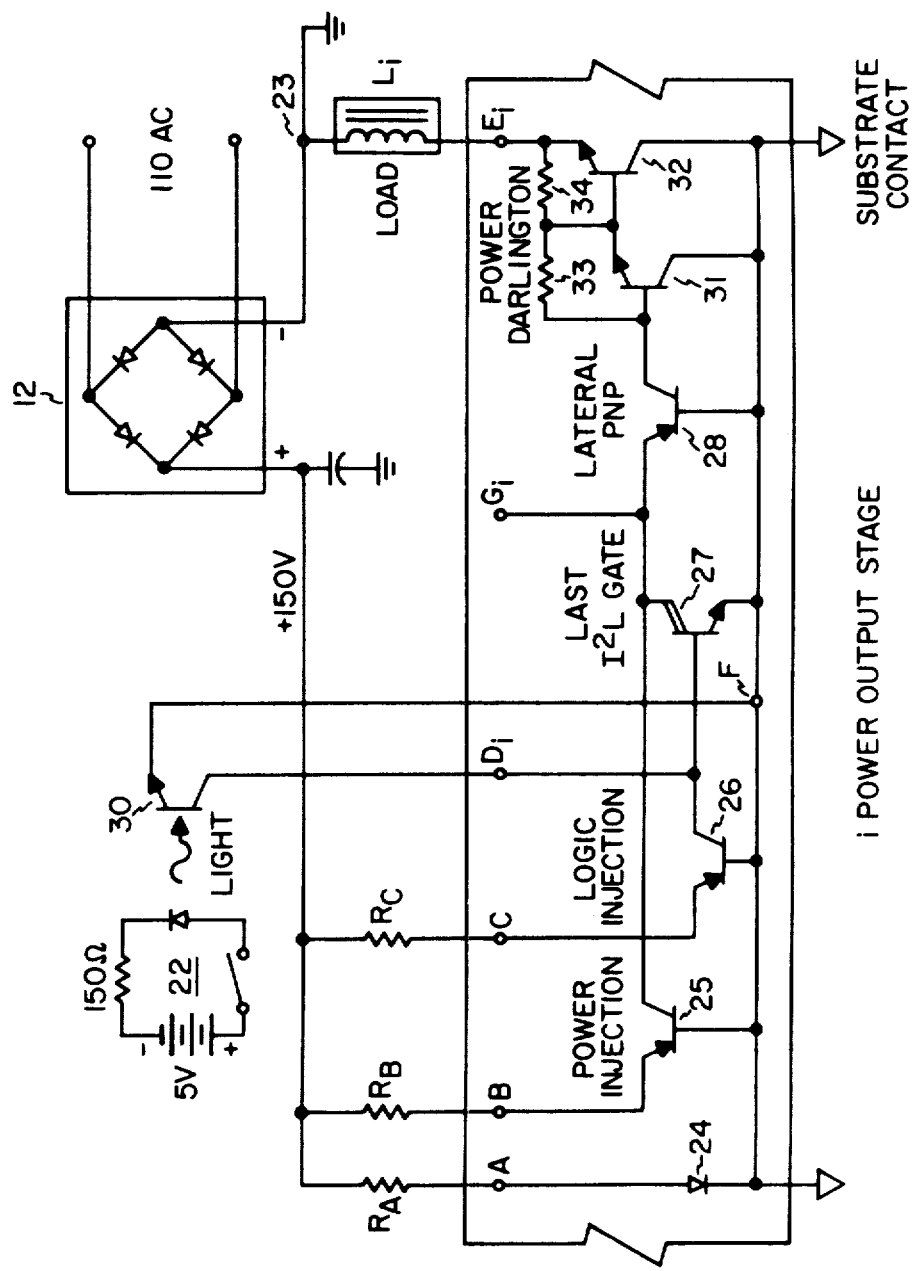
FIG. 3 is an electrical circuit diagram of a power output stage modified to include a pair of Darlington connected power transistors, and the immediately associated low voltage logic (power, load, and control connections also being provided)

The substrate 11 contains a shift register 13 (FIG. 1) to which the control information is supplied, a holding register 14 coupled to the shift register, which stores the information provided by the shift register and which has plural outputs $D_1$, $D_2$, $D_3$ and $D_4$, one used to control each of a plurality of power output stages 15, 16, 17 and 18. Suitable power output stages are illustrated in FIGS. 2 and 3. The substrate also includes a suitable timing and control block 19. The shift register 13, the holding register 14, the timing and control block 19 and the control portion of each power output stage use "integrated injection logic" suited for the low voltage (0.7 volts) energization mentioned above.

FIG. 2 illustrates a first power output stage, which may form a portion of the monolithic substrate 11 and which is suitable for controlling, by means of an optical coupler, the application of power from an ac source to a single load. The power is applied from a 110 volt, 60 cycle ac main through the rectifier 12 to the dc circuit. The positive rectifier terminal is connected via resistances $R_A$, $R_B$ and $R_C$ to the substrate terminals respectively denominated A, B, and C. The other terminal of the rectifier is connected to node 23, shown as ground. The load ($L_i$) is coupled between the emitter of a high voltage NPN transistor (terminal $E_i$) and ground 23. The optical coupler (22,30) provides suitable means for the application of a control signal. The light source of the optical coupler includes a 150 ohm resistor, a 5 volt battery and a light emitting diode. The light emitting diode illuminates a light sensitive NPN transistor 30, shown with the collector connected to the logic input terminal $D_l$ and its emitter connected to the substrate contact F. Conduction or non-conduction of transistor 30 determines the state of conduction of the power output stage and controls the application of power to the load $L_i$.

The power output stage has both low voltage I²L (Integrated Injection Logic) control components and high voltage power components. The low voltage, control components include the diode 24, lateral current injection transistor 25 for the power components, lateral current injection transistor 26 (for the last logic gate 27) and the last I²L gate transistor 27. The high voltage, power portion of the power output stage includes the lateral PNP transistor 28 and the vertical NPN power transistor 29.

The components of the power output stage on the substrate 11 are interconnected as follows. Diode 24 has its anode coupled to terminal A and its cathode coupled to the substrate contact F where it holds the substrate at a diode drop below the voltage at terminal A. It has sufficient area to carry the current through all loads. As earlier noted, resistances $R_A$, $R_B$ and $R_C$ adjust the potentials between the substrate terminals A, B and C for proper operation of the low voltage components. The transistor 25 which provides current injection to the power stages has its base connected to the substrate ground F, its emitter coupled to terminal B and its collector connected to the terminal $G_i$ and to the emitter of the high voltage lateral PNP transistor 28. The injector 25 provides emitter current for operation of the lateral PNP 28. The transistor 26, which provides current injection to the last I²L gate (27), has its base connected to the substrate contact F, its emitter coupled to power input terminal C and its collector coupled to the data input terminal $D_i$ and to the base of the I²L transistor 27. The emitter of transistor 27 is coupled to the substrate contact, and the two collectors of transistor 27 are joined together and coupled to the emitter of lateral PNP power transistor 28. The base of transistor 28 is connected to the substrate contact and the collector of 28 is connected to the base of the NPN power transistor 29. The power transistor 29 has its collector coupled to the substrate contact and its emitter connected to the power output terminal $E_i$.

The application of power by the power output stage occurs in the following manner. The principal current path connecting the rectifier with the load $L_i$ includes in succession: the resistance $R_A$, supply terminal A, diode 24, substrate contact F, the collector and the emitter, respectively, of the power transistor 29, load terminal $E_i$, the load $L_i$, and finally ground 23 to which the rectifier is also returned. When the NPN transistor 29 is conductive, a low impedance path is provided from source to load. When the transistor 29 is nonconductive, the principal current path is broken and no current flows to the load.

The I²L transistor 27 and the lateral PNP 28 control the state of the NPN power transistor 29 in response to the control signals applied from the optical source 22 to the light sensitive transistor 30. Assuming normal circuit energization, and the absence of a signal from the optical source, the transistor 30 is off and the terminal $D_i$ is unconnected to the substrate ground contact. With transistor 30 nonconducting, the I²L current injection transistor 26 supplies current to transistor 27, turning it on and creating a low impedance shunt path between the emitter of the lateral power transistor 28 and the substrate contact. The current injector 25 provides a current (1–5 ma) adequate to turn on the lateral PNP 28, but with the current diverted to the substrate ground by conduction of gate 27, the lateral PNP 28 is held nonconductive. With the lateral PNP 28 non-conductive, inadequate base current is provided to turn on the NPN power transistor 29 and it remains off, keeping the load ($L_i$) unenergized. In the presence of a signal from the optical source 22, the transistor 30 is turned on and the terminal $D_i$ is held approximately to the potential of the substrate contact. With transistor 30 conducting, an alternate path is provided for current from I²L current injector 26, diverting current that would have been supplied to the I²L transistor 27 and turning it off. The power current injection transistor 25 now supplies current to the emitter of the lateral PNP transistor 28 (which current is no longer diverted by transistor 27) and turns PNP 28 on. With lateral PNP 28 conductive, adequate base current is supplied to the power NPN 29 and it is turned on, energizing the load.

The operation just detailed is efficient in its use of power. The current injection stage 25 for the power stages, the current injection stage 26 for the I²L gate 27, and the I²L gate 27 all operate at low currents and powers, typically on the order of from 0.1–1 milliamperes at a voltage of about 0.7. The power consumption in the logic stages is thus on the order of from 0.1 to 1 milliwatts. The lateral PNP 28 provides the required voltage gain which, in response to the 0.7 volts control signal, turns on or off the 150 volts used to energize the load. In an exemplary case, the power injection stage 25 provides 1–5 milliamperes of current for the lateral PNP 28. The power NPN operates at approximately 150 volts with from 75–100 milliamperes of load current for control of an approximately 10 watt load. A high voltage requirement is placed on the NPN 29 and the lateral PNP 28, which depends both on the voltage of the power supply, the amount of ripple and the reactance in the load. Both power devices should be designed for high voltage operation, and in the present embodiment a suitable value is 400 volts (RBSOA-Reverse Bias Safe Operating Area).

The power output stage may take another form as illustrated in FIG. 3. In FIG. 3, the NPN power transistor 29 of FIG. 2 is replaced by a pair of Darlington connected power transistors 31 and 32. The connection is conventional with the collector of the transistors being connected to substrate ground, the base of the first transistor 31 being connected to the collector of the lateral PNP 28 (using the same reference numerals as employed in FIG. 2), the emitter of the transistor 31 being connected to the base of the transistor 32 and the emitter of transistor 32 being connected to the load terminal $E_l$. The customary biasing resistances 33 and 34 are provided connected respectively between the base and emitter of transistor 31 and the base and emitter of transistor 32. The Darlington arrangement provides additional current gain over that provided by a single NPN power transistor.

The disparate requirements of the power output stages and the I²L logic dictate disparate designs for the semiconductor structures. The former requires a high voltage, high power design on the one hand, and the latter a low voltage, low power design on the other hand. In detail, these disparate requirements dictate a lightly doped thick epitaxial collector, a deep base diffusion, a low base sheet resistivity for the high voltage components, For the low voltage components, the epitaxial emitters should be heavily doped, the base should be shallower and have a high base sheet resistivity. The manner that this is achieved may be seen from a consideration of FIGS. 4a and 4b.

Figure 4A:
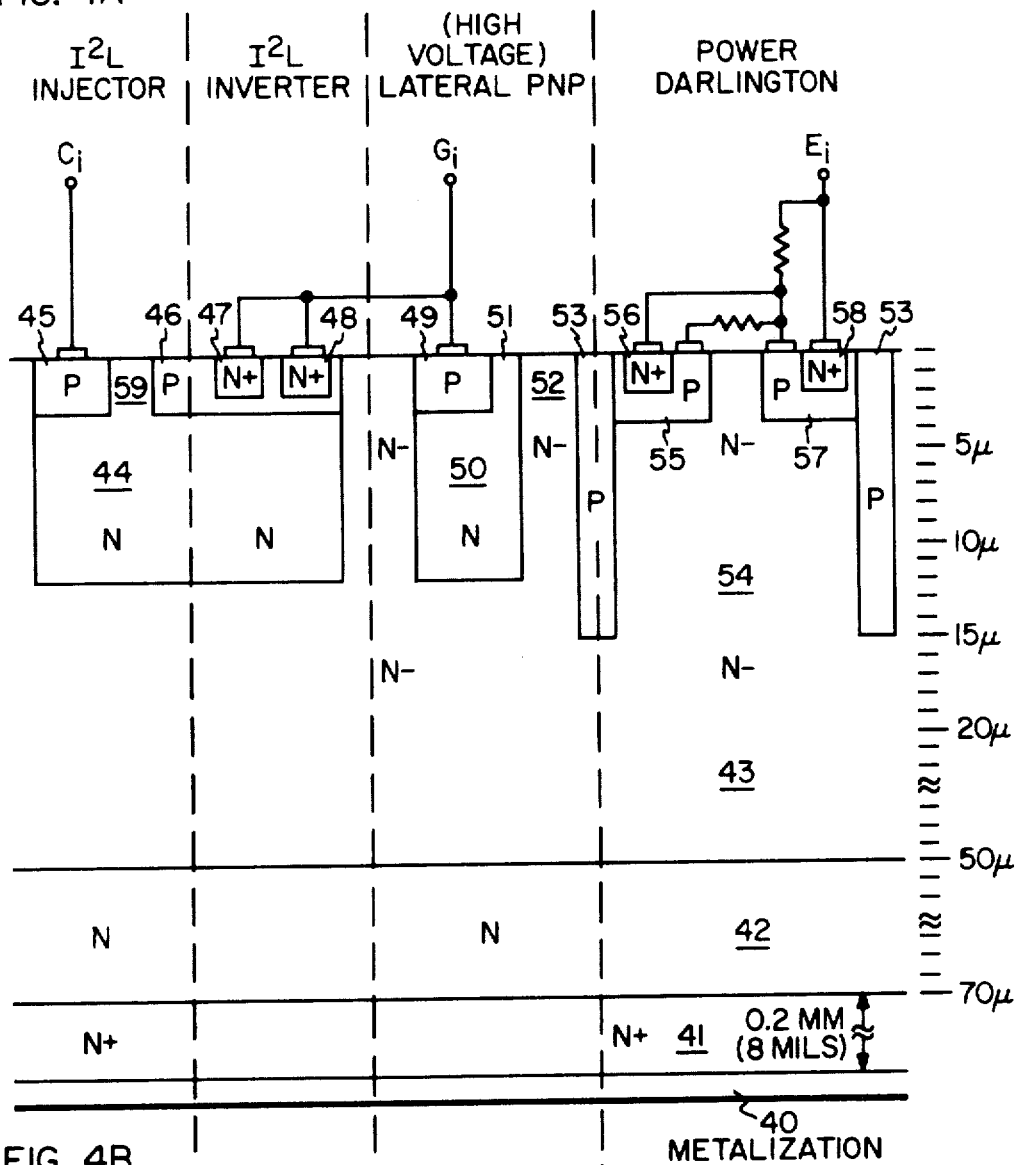

In FIG. 4a, a cross section of representative integrated devices of the FIG. 3 circuit arrangement is illustrated. The devices structurally represented in FIG. 4a are illustrated by circuit representations immediately beneath in FIG. 4b. The devices in FIGS. 4a and 4b proceeding from left to right, include the I²L lateral PNP current injector 26, the I²L vertical NPN inverter 27, the high voltage lateral PNP 28, and the Darlington connected vertical NPN power transistors 31 and 32. The I²L vertical devices have their emitters down and collectors up, while the NPN power devices are of an opposite orientation with the collectors down and the emitters up. As the nomenclatures suggest, the lateral devices, and in particular the lateral current injector 26, and the lateral PNP power transistor 28, have their (P) emitter, (N) base, and (P) collector regions arranged side by side, proceeding from left to right in FIG. 4a.

The scale conventions of FIG. 4a should also be explained. The silicon substrate 11, in the present embodiment, is approximately 8 mils in thickness, developed on the upper surface and has a metallic contact 40 on the under surface. The major portion of the substrate is a very highly doped N+ region 41 having a bulk resistivity of approximately 0.005–0.016 ohm centimeters. The 70 micron epitaxial layer is in turn subdivided into a lower layer 42 of approximately 20 microns thickness having a bulk resistivity of 1¼ ohm centimeters, and an upper layer 43 of approximately 50 microns thickness, having a bulk resistivity of ≈50 ohm cms, in which the active devices are formed. The deepest device structures, measuring from the upper surface of the epitaxial layer 43, have a downward penetration of approximately 15 microns. In general vertical scale consistency has been preserved between the upper P and N regions. The lateral scale of the P and N regions is arbitrary for ease in illustration. The surface areas of the actual devices should in fact reflect the currents and power involved. In practice, the I²L logic is quite small, occupying perhaps 10 to 20% of the surface area of the substrate (assigned to a power output stage), while the lateral PNP 28 and the Darlington transistors 31, 32 are quite large, occupying 90 to 80% of the same surface area.

Figure 4B:
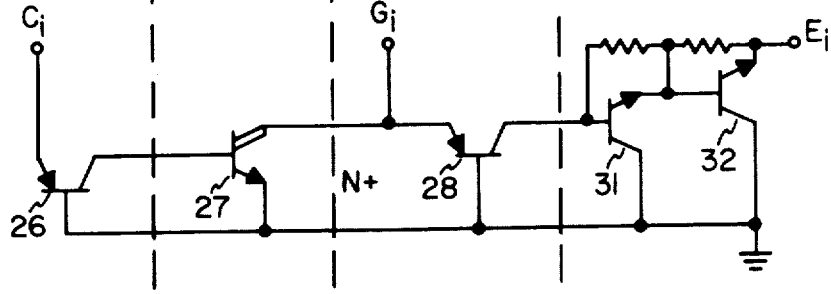

The particulars and functions of the structures shown in FIG. 4a may be understood by reference to the circuit representations of FIG. 4b. The leftmost devices 26 and 27 are formed of the regions 44, 45, 46, 47, 48 and portions of the layers (40–43) beneath region 44. Commencing at the upper left side of the figure, an "N" region 44 is shown extending downward to a depth of approximately 12 microns from the upper surface of the substrate. The leftmost portion of region 44 underlies a shallow P region 45, extending downward 2–3 microns from the upper surface of the substrate. P region 45 bears a contact and is the emitter of the lateral PNP 26. The "N" denotes a more heavy doping than that of the underlying layer 43 denoted "N−". An extension 59 of region 44 extends upwardly to the top surface of the substrate to the right of region 45 and serves as the base region of the lateral PNP 26. A second shallow P region 46 extends downward 2–3 microns from the upper surface of the substrate overlying the rightmost portion of region 44. The leftmost portion of P region 46 forms the collector of the lateral PNP 26 completing that device. The rightmost portion of the P region 46 forms the intrinsic base of the I²L inverter 27, overlying the rightmost portion of the region 44, which with portions of the underlying layers (40–43) is the emitter of the inverter 27. The N+ regions 47 and 48 formed to a depth of 1–2 microns into the upper surface of P region 46, which are electroded, provide the two collectors of the inverter 27, and complete the device.

The next device to the right is the high voltage lateral PNP transistor 28, which as will be seen, shares a P region with the vertical NPN power transistor 31. The shallow (2–3 micron) P region 49 is the emitter of the lateral PNP 28, and is formed in a deeper N region 50, extending beneath and bounding the emitter region 49 on the right-hand side. The N region 50, like region 44, is more heavily doped than the N− layer 43. The upper extension (51) of the N region 50 is of higher conductivity than the N− region 52 (an upward extension of the layer 43) immediately to the right. The N, N− regions 51 and 52 form the base of the lateral PNP 28. The region 53 which is a deep P ring developed to a depth of approximately 15 microns around the vertical NPN power devices, forms the collector of the lateral PNP. The N portion 51 of the base region provides a high voltage barrier permitting a shorter width base region than if the N− region 52 alone existed, and thus enhances the gain of the lateral device. The graded base attributable to the ion implantation further enhances the gain of the lateral PNP.

The last two devices to the right are the high voltage vertical NPN power transistors 31 and 32. They are disposed within the deep guard ring 53 and their collectors share that portion 54 of the N− layer 43 between the guard rings and the portion of the N− layer 43 beneath the portion 54. The leftmost portion of 54 and the underlying portion of the layers 40-43 form the collector of the first NPN 31. The P region 55 immediately above extending downwardly 3-4 microns, is the base of the first NPN 31. An N+ region 56 extending downwardly 1-2 microns into the P region 55 is the emitter, completing the first vertical NPN 31 of the power Darlington. The second vertical NPN 32 is similarly formed. The collector of 32 consists of the rightmost portion of 54 and the underlying portion of regions 40-43. The base and emitter of NPN 32 consist of the P region 57 and the N+ region 58, formed into region 57. In both NPN devices 31 and 32, the base P regions 55 and 57 are each electroded. Both base regions surround the respective shallower emitter regions 56 and 58 included therein; both base regions are mutually separated by an upwardly extending portion of N− region 54, and both base regions are in contact with the surrounding guard ring 53. Thus, the leftmost portion of the guard ring 53, which forms the collector of lateral PNP 28 maintains electrical continuity with the P base region 55 of NPN 31, and supplies the illustrated electrical connection between the devices.

In the matter of surface area, the lateral PNP is a large area device, much larger than any I²L device, having a surface area comparable to that of the NPN 31. The NPN device 32 has typically three to four times the surface area of the NPN 31.

Figure 5:
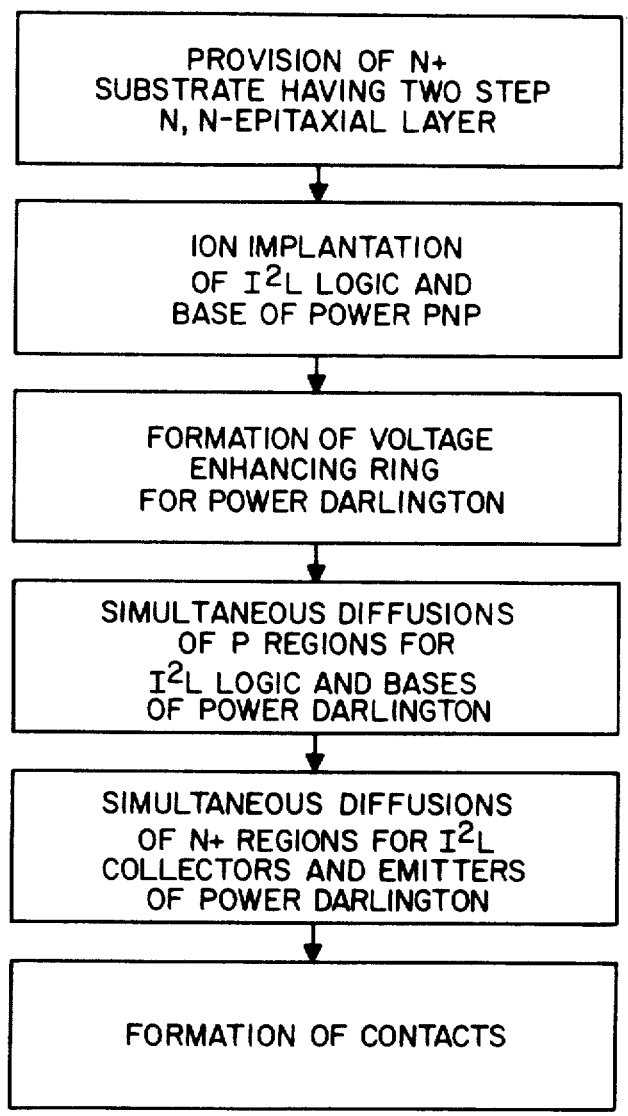
FIG. 5 is a simplified chart of the processing steps for the integrated circuit.

The composite integrated circuit illustrated in FIGS. 4a and 4b may be fabricated in a relatively simple process which is outlined in FIG. 5. That process and additional features of the finished integrated circuit will now be explained. The initial substrate is a 16 mil (0.4 mm) N+ wafer, later lapped to 8 mil (0.2 mm), having the two step collector 42, 43. The substrate selection is optimized for fabrication of the NPN power device. The process will be seen to follow the conventional steps for fabrication of the NPN devices with certain novel modifications introduced to also permit convenient fabrication of the low voltage I²L devices.

The two step N, N− regions 42, 43 enhance the Reverse bias Safe Operating Area (RBSOA) of the power NPNs 31, 32, and reduce leakage to the substrate of the lateral PNPs (26, 28). The effect also improves the gain of these devices. In general, both effects are more pronounced upon the high voltage lateral PNP.

Accordingly, as shown in FIG. 5, the first step of the process is the provision of an N+ substrate having a two step N, N− epitaxial layer.

The second step of the process is the ion implantation of the I²L logic and a part of the base of the lateral HV PNP. The ion implantation is done with a thick oxide coating the epitaxial layer except for a window formed for the I²L logic and for a part of the base of the PNP 28. The implantation may be of phosphorous and should be diffused into approximately 10-12 microns in depth. (The diffusion is achieved simultaneously with the deep P ring diffusion performed at a later stage.) The impurity count of the N− region is $10^{14}$ atoms per cm$^3$, while that of the implantation commences at a number in excess of $10^{16}$ atoms per cm$^3$ at the surface, tailing off nonlinearly to $10^{14}$ at a 9-10 microns depth.

The third step of the process is the formation of a voltage enhancing ring for the power Darlington. The step is performed by creating a ring-shaped opening in a thick oxide window drawn around the perimeter of the two devices. The step may be performed with a deep P diffusion to 15-17 microns, which extends well below the base of the Darlington NPNs. Alternatively, a shallow P− implantation may be employed continued to a depth slightly less than that of the bases of the Darlington NPNs.

The fourth step of the process is the simultaneous diffusion of the shallow P regions for the I²L logic and the slightly deeper P regions for the power bases. Due to the differing initial impurity levels of the I²L logic and the bases of the power NPNs, the same diffusion, which produces a P region to a 2-3 micron depth in the I²L logic, will produce a P region to a 3-4 micron depth in the base of the power NPN.

The fifth step of the process is the simultaneous diffusion of the N+ region for the I²L collectors and the emitters of the power NPNs. In this step, both N+ regions continue down to a depth of approximately 2 microns, leaving a shallow base of less than a micron thickness for the I²L device, and a thicker base of nearly two microns for the base of the power NPNs.

The sixth step is the formation of the contacts on the upper and lower surfaces of the substrate. This step includes the lapping of the underside of the substrate to the final thickness prior to application of the substrate contact.

The introduction of the phosphorous implantation into the I²L logic and into the lateral HV PNP permits one to modify a process otherwise optimized for processing the NPN Darlington devices to achieve greatly improved performance for all three. The high voltage components require a deeper base diffusion, a lightly doped, thick epitaxial layer and a generally low base sheet resistivity. The I²L devices on the other hand require a shallow base diffusion, a highly doped epitaxial emitter, and a high base sheet resistivity. These conflicting requirements are met by the process herein described. The original substrate is selected with the requirements of the high voltage components in mind. The introduction of the phosphorous implantation forces the base diffusion to be narrow, as earlier noted, · by essentially reducing the depth of the lower surface of the I²L P diffusion in respect to the P diffusion for the power devices. Since the N+ diffusions of both devices are of constant depth, the net thickness of the two base regions differ by approximately two by one. The emitters in the I²L devices should be highly doped, a condition which is produced by the implantation. The configuration also provides a separate control of the sheet base resistivity, which may be higher for the I²L device than for the power NPNs.

As earlier noted, the N+ ion implantation instituted to improve the I²L, but carried on simultaneously in the base region of the lateral HV PNP 28, improves the high voltage performance. Similarly, the deep P ring or the P ion implantation helps achieve a like high voltage performance on the part of the Darlington NPNs. Also, the two step collector structure (the N, N− regions 42, 43), which improves the voltage performance of the NPNs also improves the current gain of the lateral HV PNP. Thus, several of the steps have plural benefits.

Other variations of the invention are practical. The electrical circuit may provide increased power by increasing the areas of the power devices. The I²L logic, while shown having separate power connections (A, B, C), may also be energized by a single connection, with suitable adjustments of the electrical design, including elimination of the resistors $R_A$, $R_B$, $R_C$.

In the processing, the initial substrate is conventionally antimony doped for the N+ region, with the epitaxial layer of phosphorous. Equivalent dopants may also be used. The P implantation and P diffusions (steps 3 and 4) are preferably boron but may be the other conventional dopants. The N implantation and N diffusion is typically phosphorous but may use other N type materials.

While the practical embodiment shows four 10 watt loads, one may readily scale down or scale up the power semiconductors to accommodate smaller or larger individual loads. One may also accommodate larger numbers of loads by the addition of additional power output stages. Likewise, the complexity of the I²L logic may also be increased (or lessened) as desired to achieve a desired load control function.

While the illustrated embodiments show a bridge rectifier and a filter capacitor across the dc terminals of the bridge, other variations are possible. For instance, half-wave rectification may be adequate or desirable from the viewpoint of energizing ac solenoids. Filter capacity may be reduced if it is connected between terminals C and F to insure continuous logic operation.

The PNP power injector is fabricated by the same process steps as the I²L injector, but has aproximately 10 times more area for higher currents. Alternatively, the injection current into the PNP may be supplied by a resistance connected to terminal $G_i$.

What is claimed as new and desired to be secured by Letters Patent of the United States is:

1. A method for making an integrated circuit of the type including low voltage and high voltage semiconductor devices on a single substrate comprising:
   A. providing a substrate having an underlying highly doped first region of a first conductivity type, with a second moderately doped region of said first conductivity type overlying said first region;
   B. increasing the doping level with device patterning from the upper surface of said substrate within said second region to form a third, patterned region;
   C. simultaneously diffusing an impurity of a second conductivity type with device patterning into said second and third patterned regions to produce a fourth, device patterned region, the portions of said fourth region overlying said third region having a depth differing from those portions of said fourth region overlying said second region; and
   D. simultaneously diffusing an impurity of said first conductivity type with device patterning to produce a fifth, device patterned region overlying said fourth region to form vertically developed semiconductor devices wherein said developed devices formed from said third, fourth and fifth regions have a vertical geometry differing from devices formed from said second, fourth and fifth regions.

2. The method of claim 1 wherein
said doping level is increased in said third region in respect to said second region by ion implantation of an impurity of said first conductivity type.

3. The method of claim 2 wherein
said diffusion of said second conductivity type forming said fourth region is patterned to form at least one laterally developed semiconductor device complementary to said vertically developed semiconductor devices.

4. The method of claim 2 wherein
said diffusion of said second conductivity type forming said fourth region is patterned to form at least one laterally developed semiconductor device in said third region, complementary to said vertically developed semiconductor devices.

5. The method of claim 2 wherein
said diffusion of said second conductivity type forming said fourth region is patterned to provide two laterally displaced regions of said second conductivity type, between which a portion of said second region of said first conductivity type is interposed, to form at least one laterally developed semiconductor device complementary to said vertically developed semiconductor devices.

6. The method of claim 5 wherein
said diffusion of said second conductivity type forming said fourth region is patterned to provide two laterally displaced regions of said second conductivity type, one lying over said third region and the other lying over said second region to form an emitter and collector of said laterally developed semiconductor devices respectively, a base thereof including portions of said second and third regions of said first conductivity type, forming a graded base for improved performance.

7. The method of claim 5 wherein
the provided substrate has a two layer second region, said third and fourth regions being formed in the upper layer, the lower layer being of a higher impurity level than the upper layer to improve the high voltage performance of the vertically developed devices and reduce the leakage and increase the gain of the horizontally developed devices.

8. The method of claim 5 wherein
said first conductivity type is N type and said second conductivity type is P type.

9. The method of claim 2 wherein
said diffusion of said second conductivity type forming said fourth region is patterned to form at least one laterally developed semiconductor device, the base thereof including a portion of said third region and a portion of said second region, said device being complementary to said vertically developed semiconductor devices.

10. The method of claim 2 wherein
a ring of said second conductivity type is formed around said vertically developed devices in said second region, positioned for contact with the diffusion of step C, for enhancing high voltage performance, said ring formation occurring between steps B and C.

11. The method of claim 10 wherein said ring is formed by diffusing an impurity of said second conductivity type to a depth exceeding said third region.

12. The method of claim 10 wherein said ring is formed by implanting an impurity of said second conductivity type to a depth comparable to the depth of said fourth region.

* * * * *